United States Patent [19]
Dionne

[11] 3,995,214
[45] Nov. 30, 1976

[54] MOVABLE MAGNET METER HAVING ROTATION COMPENSATING MEANS

[75] Inventor: Norman J. Dionne, Arlington Heights, Mass.

[73] Assignee: Raytheon Company, Lexington, Mass.

[22] Filed: Sept. 25, 1975

[21] Appl. No.: 616,781

[52] U.S. Cl. ............................ 324/146; 324/151 A
[51] Int. Cl.² ...................... G01R 1/38; G01R 5/16
[58] Field of Search ........ 324/132, 146, 147, 151 R, 324/151 A, 152

[56] References Cited
UNITED STATES PATENTS

| | | | |
|---|---|---|---|
| 2,175,046 | 10/1939 | Warner | 324/146 |
| 2,333,991 | 11/1943 | Faus | 324/146 X |
| 2,345,011 | 3/1944 | Sias | 324/146 X |
| 2,450,331 | 9/1948 | Giers et al. | 324/146 X |
| 2,498,261 | 2/1950 | Fritzinger | 324/146 X |
| 2,978,639 | 4/1961 | Lawson | 324/146 |
| 3,275,936 | 9/1966 | Huston | 324/146 |

*Primary Examiner*—Gerard R. Strecker
*Attorney, Agent, or Firm*—John T. Meaney; Joseph D. Pannone; Harold A. Murphy

[57] ABSTRACT

A magnetic metering system comprising a transversely magnetized cylinder carrying a radially extending pointer and mounted for axial rotation between a diametrically disposed pair of biasing magnets and a diametrically disposed pair of solenoid coils, and rotation compensating means disposed between the biasing magnets and the solenoid coils for providing the cylinder and pointer with an angular movement proportional to changes in a current flowing through the solenoid coils.

10 Claims, 8 Drawing Figures

MOVABLE MAGNET METER HAVING ROTATION COMPENSATING MEANS

BACKGROUND OF THE INVENTION

This invention relates generally to metering systems and is concerned more particularly with a meter of the movable magnet type having rotation compensating means.

A current measuring meter of the movable magnet type generally comprises a transversely magnetized cylinder carrying a radially extending pointer and disposed axially between a "zero aligning" pair of magnetic pole pieces. The cylinder is mounted for rotation from the zero angular position in accordance with a current passing through a diametrically disposed pair of solenoid coils, which are angularly spaced from the zero aligning pair of pole pieces. Thus, the pointer carried by the cylinder is deflected from the zero position and travels arcuately over a dial face to indicate the value of current passing through the coils. However, it has been found that the pointer may not sweep through equal arcuate portions of the dial for corresponding equal changes in the value of the current. As a result, the pointer may indicate an erroneous value for the current passing through the coils.

Therefore, it is advantageous and desirable to provide a meter of the movable magnet type with means for ensuring that the cylinder and pointer will be rotated through equal angular displacements in proportion to corresponding equal changes in the quantity being measured.

SUMMARY OF THE INVENTION

Accordingly, this invention provides a meter of the movable magnet type having rotation compensating means for producing an angular meter movement in proportion to the quantity being measured. The meter includes a transversely magnetized cylinder carrying a radially extending pointer and mounted for axial rotation between respective angularly spaced pairs of diametrically disposed aligning magnets and solenoid coils. Preferably, the angle between each of the aligning magnets and the clockwise adjacent coil is greater than ninety degrees.

The rotation compensating means comprises a diametrically disposed pair of soft magnetic compensators which are located between respective aligning magnets and solenoid coils, and angularly spaced therefrom. Each of the soft magnetic compensators may comprise a unitary soft magnetic member or a plurality of soft magnetic members.

In a preferred embodiment, each of the soft magnetic compensators comprises a respective soft magnetic member located at an angle of approximately ninety degrees from a line drawn through the center of the magnetized cylinder and extending centrally through the solenoid coils. Alternatively, each of the soft magnetic compensators may comprise a plurality of soft magnetic members suitably bonded to one another so as to function as a unitary soft magnetic member.

In an alternative embodiment, each of the soft magnetic compensators comprises an arcuate array of asymmetrically spaced, soft magnetic members. The members of each array may be spaced increasingly greater distances apart in an arc drawn clockwise from the adjacent aligning magnet to a point ninety degrees from the associated coil, and may be spaced increasingly closer together in an arc drawn therefrom to the associated coil.

BRIEF DESCRIPTION OF THE DRAWINGS

For a better understanding of the invention, reference is made in the following more detailed description to the accompanying drawings wherein.

DESCRIPTION OF THE PREFERRED EMBODIMENT

Figure 1:
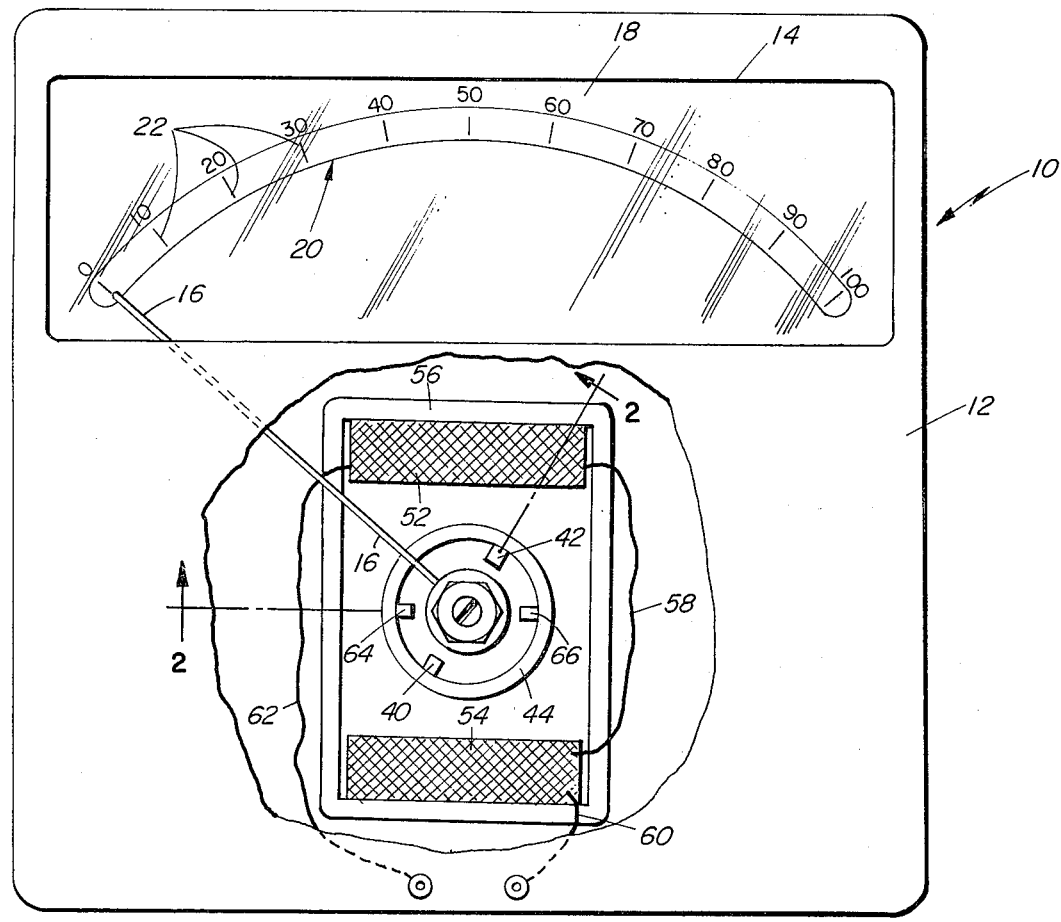
FIG. 1 is a plan view of a metering system embodying the invention.
Figure 2:
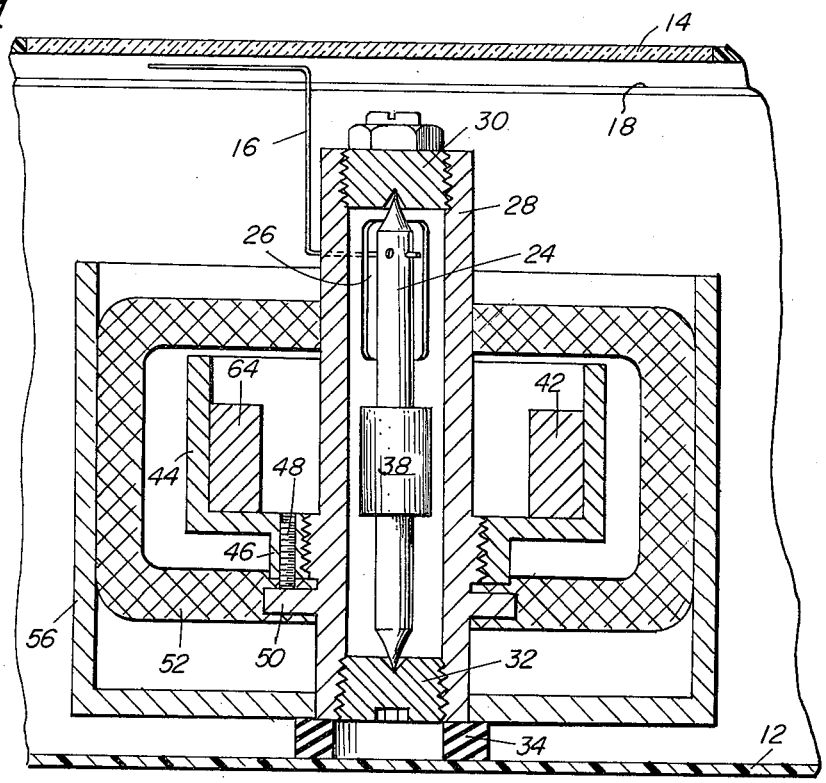
FIg. 2 is a fragmentary axial view, partly in section, taken along the line 2—2 shown in FIG. 1 and looking in the direction of the arrows.

Referring to the drawings wherein like characters of reference designate like parts, there is shown in FIGS. 1 and 2 a metering system 10 including a casing 12 made of nonmagnetic material, such as synthetic resin material, for example. Casing 12 is provided with a generally rectangular window 14 made of transparent material, such as glass, for example, through which may be observed the position of a pointer 16 with respect to an underlying dial face 18. Dial face 18 is made of suitably light rigid material, such as plastic, for example, and has disposed on the surface adjacent pointer 16 an arcuate scale 20. The scale 20 is provided with a series of equally spaced graduations 22 whereby angular displacements of pointer 16 may be measured.

Within casing 12, the pointer 16 has a distal end portion overlying scale 20 and a proximal end portion fixedly attached, by conventional means, to a rotatable shaft 24. The pointer 16 extends radially from shaft 24 and through a slotted opening 26 in an encircling support sleeve 28, which may be made of electrically conductive material, such as copper, for example. Journaled into opposing end portions of the sleeve 28 are respective jewel bearings 30 and 32 which rotatably support the shaft 24 in a well-known manner. The end portion of sleeve 28 having the bearing 32 therein may be coupled to a suitable shock absorbing member 34 which is attached, by any convenient means, to the casing 12.

The shaft 24 is made of nonmagnetic material, such as osmium, for example, and extends axially through a fixedly attached, cylindrical magnet 38 which rotates the shaft 24 within sleeve 28. The cylindrical magnet or rotor 38 is transversely magnetized to have opposing arcuate magnetic poles, and preferably is made of high coercivity magnetic material, such as samarium-cobalt, for example. Rotor 38 is axially disposed in a plane extending through two diametrically disposed, biasing magnets 40 and 42, respectively, which may be made of high coercivity material, such as barium ferrite, for example. The biasing magnets 40 and 42 have respective opposing magnetic poles disposed adjacent the rotor 38 and are supported in fixed radially spaced relationship with the sleeve 28 by means of an encircling ring 44. Biasing magnets 40 and 42 are suitably secured, as by bonding, for example, to respective opposing arcuate portions of the ring 44, which is made of nonmagnetic material, such as brass, for example. Ring 44 is provided with an internally threaded neck portion 46 which engages a threaded outer surface portion of sleeve 28. Neck portion 46 may carry an axially extending set screw 48 which may be journaled into binding engagement with a flange 50 extending outwardly from the sleeve 28. Thus, the set screw 48 provides antirotating means for locking the biasing magnets at desired angular positions with respect to other components of the metering system 10.

Diametrically disposed with respect to rotor 38 and angularly spaced a predetermined distance, in the clockwise direction, from respective biasing magnets 40 and 42 are two solenoid coils, 52 and 54, respectively. The coils 52 and 54 may be located outside of the ring 44 and supported by any suitable means, such as dielectric clamps (not shown), for example, in respective opposing end portions of a box-like enclosure or housing 56. The housing 56 preferably is made of soft magnetic material, such as iron, for example, to provide a magnetic shield for the components therein. Coils 52 and 54 are connected in electrical series by a conductor 58 and are connected to respective receptacles in the casing 12 by conductors 60 and 62, respectively. Thus, an electrical current may be passed through the coils 52 and 54 to establish a characteristic solenoid magnetic field therebetween. As a result, the axially directed portion of the solenoid magnetic field passes through the rotor 38 and tends to rotate it clockwise into alignment with the coils. Accordingly, the pointer 16 is deflected along the scale 20 an angular distance depending on the value of the current flowing through the solenoid coils 52 and 54, respectively.

However, it has been found that the pointer 16 does not sweep through equal arcuate increments of the scale 20 in proportion to corresponding equal changes in the value of the current being measured. Consequently, in accordance with this invention, there is disposed between the respective biasing magnets 40 and 42 and the clockwise adjacent coils 52 and 54, respectively, a rotation compensating means comprising soft magnetic members 64 and 66, respectively. The rotation compensators 64 and 66 are diametrically disposed with respect to the rotor 38 and are spaced a predetermined angular distance, in the clockwise direction as viewed in FIG. 1, from the adjacent biasing magnet, 40 and 42, respectively. Rotation compensators 64 and 66 may conveniently be secured, as by bonding, for example, to respective opposing arcuate portions of the ring 44, whereby the compensators preferably may be supported in a plane passing through rotor 38, biasing magnets 40 and 42, and solenoid coils 52 and 54. Each of the compensators 64 and 66, respectively, comprises an unsaturated magnetic material which preferably has high susceptibility characteristics, such as soft iron, for example. Also, each of the compensators, 64 and 66, respectively, may comprise a unitary soft magnetic member or plurality of soft magnetic members which are suitably coupled to one another, as by bonding, for example.

Figure 3:
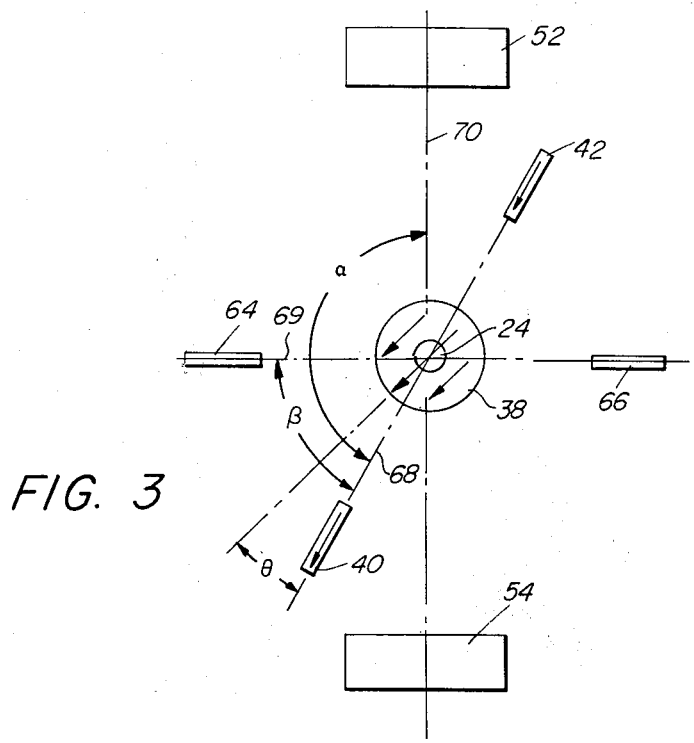
FIG. 3 is a schematic view illustrating the operation of the metering system shown in FIG. 1.

As shown in FIG. 3, the biasing magnets 40 and 42 establish a magnetic field which is directed along a diametric line 68 drawn through the center of rotor 38 and extending through the biasing magnets 40 and 42, respectively. Consequently, the biasing magnets 40 and 42 tend to rotate the rotor 38 in a direction which will bring the transverse magnetic field of the rotor into alignment with the line 68. However, the rotor 38 also is attracted to the soft magnetic compensators 64 and 66, respectively, which are disposed on a diametric line 69 which is spaced a predetermined angle $\beta$ in the clockwise direction, from the line 68. As a result, the rotor 38 initially comes to rest at an intermediate equilibrium position where its transverse magnetic field forms an angle $\theta$ in the clockwise direction, with the line 68. Thus, when the rotor is disposed at the initial equilibrium angle $\theta$ with the line 68, the pointer 16 is positioned over the zero angular position on scale 20.

When a current passes through the solenoid coils 52 and 54, it establishes a solenoid magnetic field having an axial component which is directed along a diametric line 70. Line 70 passes through the center of rotor 68 and extends through the respective coils 52 and 54 to form an angle $\alpha$, in the clockwise direction, with the line 68. Thus, as the current passing through coils 52 and 54 increases in value, the equilibrium angle $\theta$ increases accordingly; and the pointer 16 travels arcuately along the scale 20.

Figure 5:
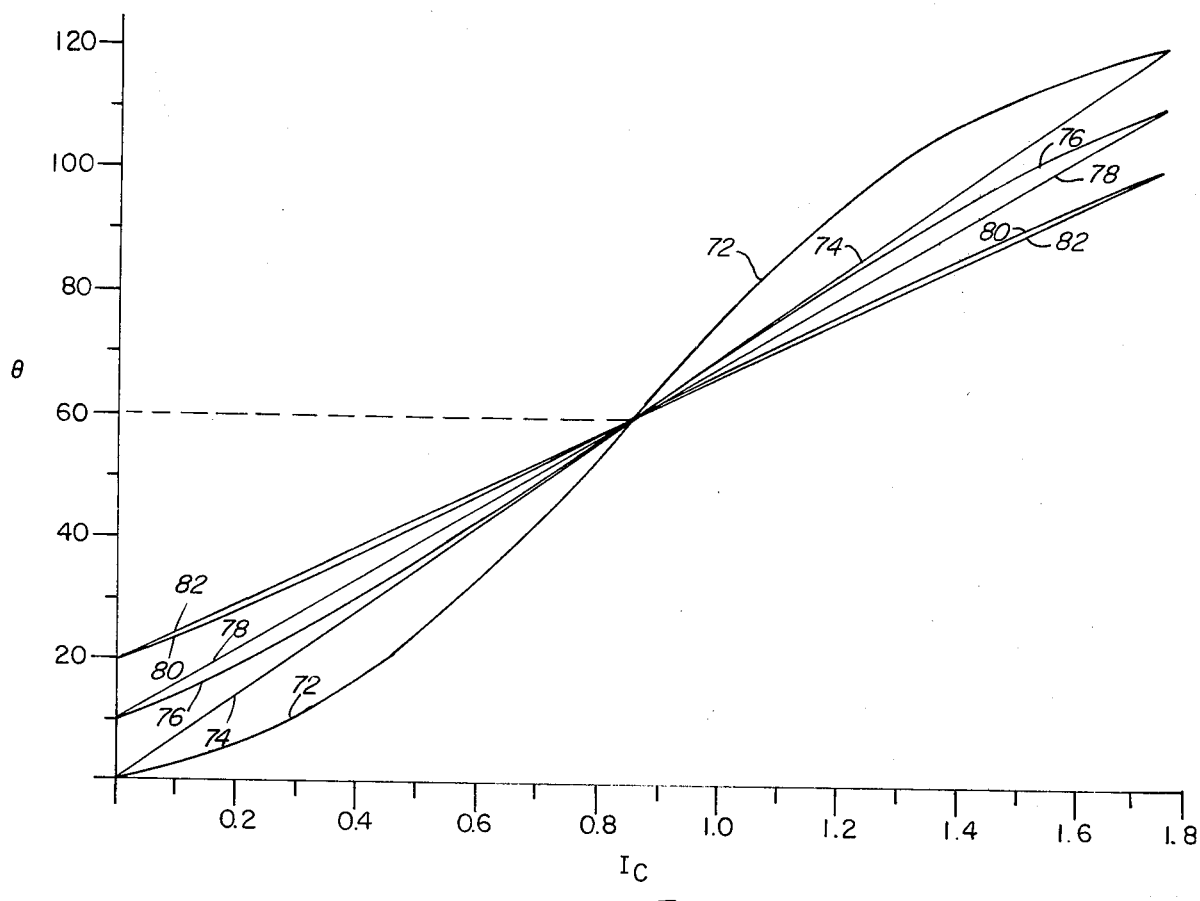
FIG. 5 is a graphical view showing the effect of this invention in correcting linearity errors in meter movement.

FIG. 5 shows a family of curves obtained for a metering system 10 having the solenoid coils disposed at an angle $\alpha$ equal to one hundred and fifty degrees. The curve 72 having a generally S-shaped configuration relative to an associated ideal linear curve 74 indicates the values of $\theta$ obtained with no rotation compensating means disposed between the coils and the biasing magnets 40 and 42. A comparison of curves 72 and 74 discloses that for values of $\theta$ less than 60°, $\theta$ does not change as rapidly as the current passing through coils 52 and 54. On the other hand, for values of $\theta$ greater than 60°, $\theta$ changes more rapidly than the current passing through the coils. As a result, $\theta$ corresponds to the value of the current being measured only at the point of inflection where $\theta$ is equal to 60°.

The curve 76 having a much shallower S-shaped configuration with respect to an associated ideal linear curve 78 was obtained when rotation compensators 64 and 66, respectively, were disposed at an angle $\beta$ equal to 60°, the point of inflection in curve 70. The compensators 64 and 66 were provided with a volume of soft magnetic material sufficient to attract the rotor 38 to an initial equilibrium angle $\theta$ equal to 10°. A comparison of the curves 76 and 78 discloses that the changes in $\theta$ below and above the sixty degree point of inflection, are much closer to the corresponding changes in the current passing through the coils 52 and 54. Thus, the rotation compensators have the effect of correcting errors in linearity of the meter movement with regard to rotational displacement of rotor 38 and pointer 12 in response to changes in current flowing through the solenoid coils.

The curve 80 is disposed in close proximity to an associated ideal linear curve 82 was obtained when the compensators 64 and 66 were provided with a volume of soft magnetic material sufficient to attract the rotor 38 to an initial equilibrium angle equal to 20°. A comparison of the curves 80 and 82 discloses that the changes in $\theta$ correspond closely to the changes in the current flowing through the solenoid coils 52 and 54. Thus, the effect of the rotation compensators 64 and 66 having the proper volume of soft magnetic material disposed at the angle of zero error is to correct deviations in linearity of the meter movement, such that angular displacements of the pointer 16 along scale 20 are proportionate to changes in the current being measured.

Figure 6:
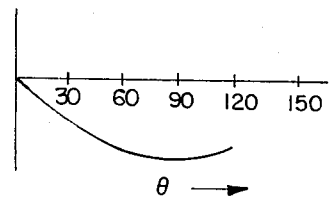
FIG. 6 is a graphical view showing the effect of the biasing magnets on meter movement.

FIG. 6 shows that, as the angle θ increases, the biasing magnets 40 and 42 exert a dragging force of countertorque on the rotor 38. However, the countertorque exerted by the biasing magnets 40 and 42 is useful in restoring the rotor 38 to the initial equilibrium position when the current is removed from the solenoid coils 52 and 54.

Figure 7:
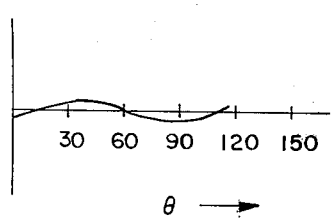
FIG. 7 is a graphical view showing the rotation compensating effect of this invention.

As shown in FIG. 7, when the angle θ increases, the rotation compensators 64 and 66 initially exert an attraction force on the rotor 38 until θ is equal to 60°. This attraction force exerted on the rotor 38 partly counteracts the dragging force exerted by the biasing magnets 40 and 42, thereby aiding the solenoid magnetic field 38 established by the coils 52 and 54. However, when the angle θ increases beyond sixty degrees, the rotation compensators 64 and 66 exert a dragging force which partly counteracts the solenoidal magnetic field, thereby aiding the restoring magnetic field established by the biasing magnets 40 and 42.

Figure 8:
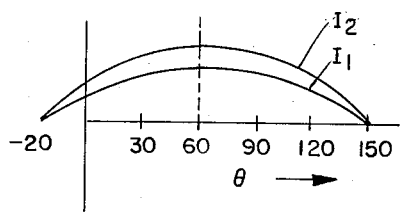
FIG. 8 is a graphical view showing the effect of the solenoid coils on meter movement.

As shown in FIG. 8, when respective currents $I_1$ and $I_2$ are passed sequentially through the solenoid coils 52 and 54, the resulting torque force exerted on the rotor 38 by the solenoidal magnetic field has a maximum value at θ equal to 60°. However, an angle θ equal to 60° corresponds to the angle β where the rotation compensators 64 and 66 are disposed. Thus, it can be shown that the angle β is equal to the angle α minus 90°. Accordingly, to provide a linearly varying rotation of the rotor 38 and the pointer 16 the rotation compensators 64 and 66 are disposed on the diametric line 69 which forms an angle of 90° with the diametric line 70 passing through the solenoid coils 52 and 54. To verify this conclusion, the biasing magnets were disposed on a diametric line which formed an angle α equal to 160° with the solenoid coils 52 and 54. Consequently, the rotation compensators were disposed at an angle β equal to seventy degrees. It was found that if the rotation compensators were provided with a soft magnetic volume sufficient to attract the rotor 38 to an initial equilibrium angle θ equal to 25°, the resulting rotational movement of the rotor 38 and pointer 16 showed an even closer relationship to the ideal linear curve than the curve 80 shown in FIG. 5.

Figure 4:
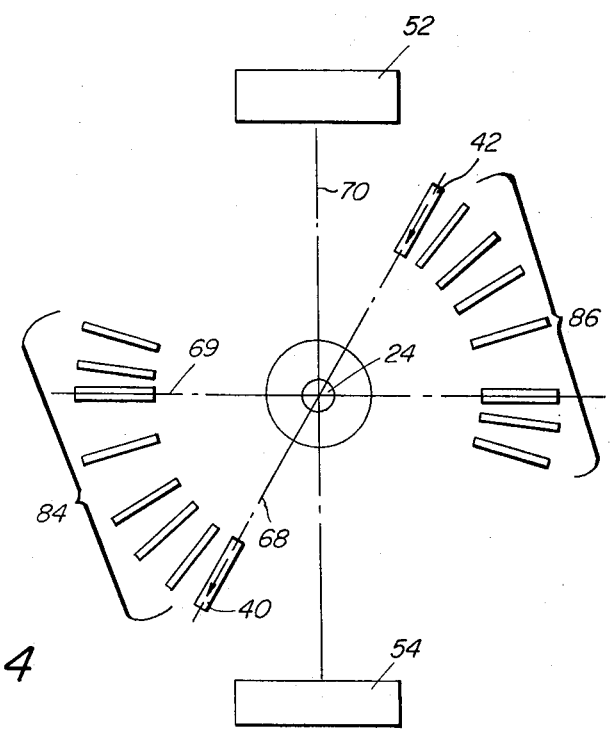
FIG. 4 is a schematic view similar to FIG. 3 but showing an alternative embodiment of the invention.

FIG. 4 shows an alternative embodiment comprising a metering system similar to the described system 10, except each of the rotation compensators 64 and 66 is replaced by a respective arcuate array of soft magnetic members or wafers 84 and 86. The soft magnetic members of the respective arrays 84 and 86 are asymmetrically spaced apart by interposed nonmagnetic material, such as brass, for example. Thus, the soft magnetic members in each of the arrays 84 and 86, respectively, may be spaced increasingly further apart in going clockwise from the adjacent biasing magnet toward the line 69, which is located 90° counterclockwise from the associated solenoid coil. In going clockwise from the line 69 to the line 70, the soft magnetic members in each of the arrays 84 and 86, respectively, may be spaced increasingly closer together. Consequently, the arrays 84 and 86 will exert an attraction force on the rotor 38 until the transverse field thereof is substantially at right angles to the solenoidal magnetic field. When the rotor 38 rotates beyond this point, the arrays 84 and 86 will exert a dragging force on the rotor 38. Accordingly, the soft magnetic members of the arrays 84 and 86, respectively, may be suitably spaced apart to provide a meter movement which varies in any manner desired with respect to the current passing through coils 52 and 54. For example, the soft magnetic members of the arrays 84 and 86, respectively, may be suitably spaced apart to provide a linearly varying meter movement when an exponentially varying current is passing through the coils 52 and 54.

Thus, there has been disclosed herein a metering system having a cylindrical magnet disposed for axial rotation between respective angularly spaced pairs of diametrically disposed biasing magnets and solenoid coils, and including rotation compensating means disposed between each of the biasing magnets and the clockwise adjacent coil for correcting linearity errors in the meter movement.

From the foregoing, it will be apparent that all of the objectives of this invention have been achieved by the structures shown and described herein. It also will be apparent, however, that various changes may be made by those skilled in the art without departing from the spirit of the invention as expressed in the appended claims. It is to be understood, therefore, that all matter shown and described herein is to be interpreted as illustrative and not in a limiting sense.

What is claimed is:

1. A metering system comprising:
   a magnetized rotor having opposing magnetic pole pieces diametrically disposed with respect to its axis of rotation and having an initial angular position;
   electromagnetic torque means radially spaced from the rotor and disposed at a predetermined angular distance with respect to the initial angular position thereof for directing a variable magnetic field through the rotor and rotating it from the initial angular position;
   magnetic countertorque biasing means disposed adjacent at least one pole piece of the rotor and magnetically coupled thereto for restraining rotational motion of the rotor from its initial angular position; and
   unsaturated magnetic means disposed at a predetermined location between the electromagnetic torque means and the magnetic countertorque means for initially cooperating with the electromagnetic torque means in rotating the rotor to a predetermined angular position and then cooperating with the magnetic countertorque means in restraining further rotational movement of the rotor, thereby ensuring that the angular displacement of the rotor corresponds substantially to the variable magnetic torque means.

2. A metering system as set forth in claim 1 wherein the electromagnetic torque means includes current carrying means diametrically disposed with respect to the rotor for angularly displacing the rotor in accordance with a current passing through the means.

3. A metering system as set forth in claim 2 wherein the current carrying means includes a series connected pair of diametrically spaced solenoid coils, the coils being axially aligned with a diametric line extended through the axis of rotation of the rotor.

4. A metering system as set forth in claim 1 wherein the unsaturated magnetic means includes a plurality of soft magnetic members disposed in radially spaced relationship with the rotor and angularly spaced a predetermined distance from the electromagnetic torque means.

5. A metering system as set forth in claim 3 wherein the unsaturated magnetic means includes an aligned pair of soft magnetic members diametrically disposed with respect to the rotational axis of the rotor.

6. A metering system as set forth in claim 5 wherein the soft magnetic members are angularly spaced substantially ninety degress from the respective coils.

7. A metering system as set forth in claim 1 wherein the countertorque biasing means includes permanent magnet means for directing a steady-state magnetic field radially of the rotor.

8. A metering system as set forth in claim 6 wherein the countertorque biasing means includes a plurality of permanent magnet members disposed in radially spaced relationship with the rotor and angularly spaced from the respective coils and the soft magnetic members.

9. A metering system as set forth in claim 7 wherein the permanent magnet means includes an aligned pair of permanent magnets diametrically disposed with respect to the rotational axis of the rotor and having respective opposing magnetic poles adjacent the magnetic pole pieces of the rotor in the initial angular position.

10. A metering system as set forth in claim 1 wherein the rotor is cylindrical and has opposing arcuate pole pieces.

* * * * *